United States Patent [19]
Widlar

[11] Patent Number: 4,587,494
[45] Date of Patent: May 6, 1986

[54] QUASI-COMPLEMENTARY CLASS B IC OUTPUT STAGE

[75] Inventor: Robert J. Widlar, Jalisco, Mexico

[73] Assignee: National Semiconductor Corporation, Santa Clara, Calif.

[21] Appl. No.: 692,136

[22] Filed: Jan. 17, 1985

[51] Int. Cl.⁴ .............................................. H03F 3/30
[52] U.S. Cl. .................................... 330/273; 330/275
[58] Field of Search ............... 330/255, 267, 268, 260, 330/273–275, 311

[56] References Cited
PUBLICATIONS

"Class A Amplifier Re-Considered", *Elektor*, vol. 2, No. 7–8, Jul.–Aug. 1976, p. 739.

*Primary Examiner*—James B. Mullins
*Attorney, Agent, or Firm*—Gail W. Woodward; Paul J. Winters; Michael J. Pollock

[57] ABSTRACT

A class B IC transistor output stage, using a pair of NPN transistors, is described. A quasi-complementary transistor is employed to establish the stage quiescent bias. An NPN bias transistor is coupled to the output sink transistor and is driven from the emitter of the input driver transistor. Therefore, the input signal is coupled to apply the signal directly to the base of the sink transistor as well as to the source transistor. This feedforward arrangement by-passes the PNP transistor when a signal is applied so that the asymmetrical performance of the PNP transistor does not adversely affect the signal performance.

4 Claims, 1 Drawing Figure

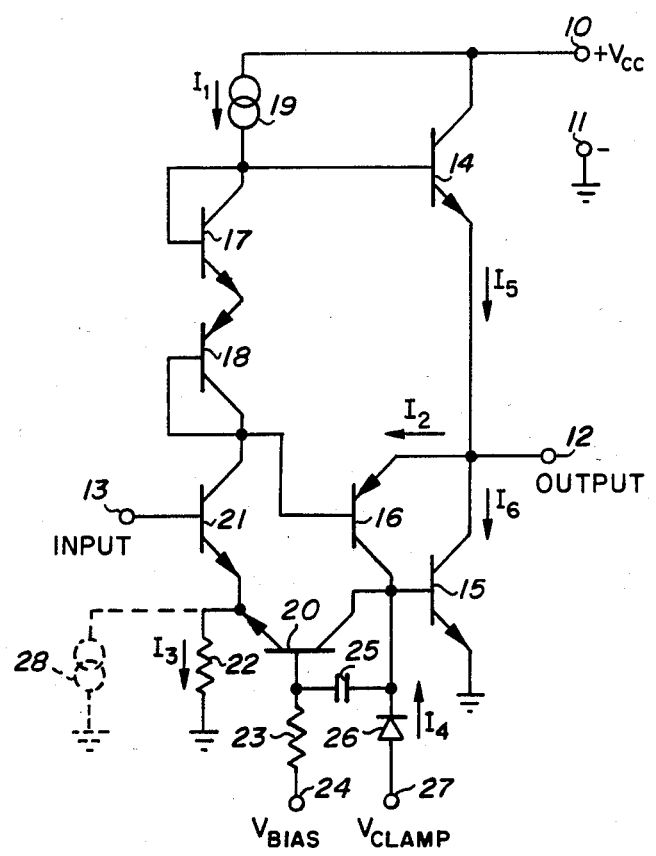

QUASI-COMPLEMENTARY CLASS B IC OUTPUT STAGE

BACKGROUND OF THE INVENTION

The invention relates to the output stage employed in a monolithic silicon integrated circuit (IC) amplifier. One well-known form of output stage is disclosed and claimed in U.S. Pat. No. 3,974,456, which was issued to Ronald W. Russell and Kyle M. Black on Aug. 10, 1976. This patent, which is assigned to the assignee of this application, discloses a pair of NPN output transistors biased by means of P-channel junction field effect transistor (JFET) devices. This circuit is exemplified in the LF156 which is available commercially from National Semiconductor Corporation and others.

Another commonly used IC amplifier output stage design which employs a complementary transistor is exemplified in the LM118, which is also commercially available from National Semiconductor Corporation and others. Here, an NPN transistor acts as an output terminal current source and hence provides the pull-up function. A PNP transistor acts as a current sink to provide the pull-down function. This configuration provides excellent performance but suffers an asymmetry in its current sinking capability. The PNP transistor is not able to sink as much current as an equivalent size NPN transistor can source. It also suffers to a small degree, at the higher frequencies, from an asymmetry in the gain versus frequency roll off. In general IC PNP transistors have a much lower gain bandwidth than the NPN transistors. When the complementary device circuit is employed at the higher frequencies, the output will display a phase shift between the positive and negative signal swings.

To overcome some of the problems of the complementary device circuit a quasi-complementary circuit has been used. Here a pair of NPN output transistors are employed, but one of them, the current sink device, is driven by a PNP transistor to create a composite pair that acts as if it were a single PNP transistor. In this circuit the actual PNP transistor only has to handle low level signals, but it is still slow so that a high frequency phase shift asymmetry is encountered. One version of such a circuit is found in the patent application of Harry J. Bittner Ser. No. 493,539 filed May 11, 1983, now U.S. Pat. No. 4,553,044, and assigned to the assignee of the present invention. Here a current mirror is employed to drive the quasi-complementary output stage.

From the above, it is clear that NPN output transistors are preferred for use in the output stage of IC devices. However, the use of JFET biasing or quasi-complementary circuits have drawbacks that would be desirable to avoid.

SUMMARY OF THE INVENTION

It is an object of the invention to employ a pair of NPN transistors in an IC output stage and to employ a quasi-complementary d-c bias with a signal drive which employs only NPN transistors.

It is a further object of the invention to employ a quasi-complementary d-c bias arrangement for a class B NPN transistor output pair and to provide an NPN transistor driver having a bias clamping arrangement to avoid saturation effects along with a Miller effect signal feedforward function.

These and other objects are obtained as follows. A pair of NPN transistors are coupled in series across the power supply with their juncture forming the stage output terminal. The sink transistor has a PNP transistor coupled to it to create a composite pair. A pair of forwardbiased diodes are coupled between the bases of the source NPN transistor and the PNP transistor. The diode bias current also flows in an NPN driver that directly drives the PNP transistor base. Due to the diodes the same driver applies a signal to the source transistor base. A feedforward transistor has its collector coupled to the base of the NPN sink transistor, its base coupled to a source of bias potential and its emitter is directly coupled to the emitter of the NPN driver. The emitters of the driver and feedforward transistors are returned to the negative supply rail through a common resistor. Therefore, the driver transistor, acting as an emitter follower, drives the feedforward transistor. A capacitor coupled between the collector and base of the feedforward transistor connects the base to the collector for the higher signal frequencies. Thus, the feedforward transistor acts as a coupling diode which allows the driver transistor to apply a signal directly to the current sink transistor base.

BRIEF DESCRIPTION OF THE DRAWING

The single FIGURE of drawing is a schematic diagram of the output stage of the invention.

DESCRIPTION OF THE INVENTION

In the circuit of the drawing the operating power supply $V_{CC}$ is connected + to terminal 10 and − to ground terminal 11. The stage output is at terminal 12 where an inverted amplified version of the signal at input terminal 13 appears. A load element (not shown) connected to terminal 12 can be supplied with source and sink currents that are substantially in excess of the quiescent stage current. Thus, a class B output stage is present. In the following discussion it will be assumed that transistor base current can be ignored with respect to collector current. Since the transistors typically display current gains in excess of 200, this approximation is valid to a first order.

Output transistors 14 and 15 are of the same conductivity type (NPN). A complementary transistor 16 (PNP) is coupled to transistor 15 to form a quasi-complementary pair. Diode-connected transistors 17 and 18 are forward biased by current source 19 which produces $I_1$. Since transistors 17 and 18 are complementary, they develop a bias that will turn transistors 14 and 16 on to set the stage quiescent current.

Transistor 16 biases transistor 15 and passes $I_2$ which also flows in transistor 20. Input transistor 21, which passes $I_1$, is coupled to directly drive the base of transistors 14 and 16 as an inverter. It also drives the emitter of transistor 20 as an emitter follower. $I_3$, which flows in resistor 22, is the sum of $I_1$ and $I_2$. In the preferred circuit design $I_2$ is made equal to $I_1$.

The actual value of $I_2$ is established by returning the base of transistor 20, through a resistor 23, to a source of bias potential at terminal 24.

Capacitor 25 is a Miller effect element coupled from the collector of transistor 20 to its base. At the higher operating frequencies capacitor 25 will force transistor 20 to act as a coupling diode. In this mode the signal at terminal 13 is coupled through emitter-follower transistor 21 and diode operated transistor 20 directly to the base of transistor 15. Thus, at the higher signal frequencies transistor 15 is driven without requiring the signal to pass through a PNP device. This action avoids the high frequency signal delay normally encountered in a complementary transistor.

The collector of transistor 20 is returned via diode 26 to a source of clamp potential at terminal 27. This combination, which nominally passes $I_4$, acts to prevent transistor 20 from saturating regardless of the signal drive level at terminal 13. Normally $I_4$ is made much smaller than $I_1$.

Under quiescent (no signal) conditions the output transistor pair (transistors 14 and 15) are biased by the combination of transistors 16, 20 and 21 along with diode connected transistors 17 and 18. $I_5$ flows in transistor 14 and $I_6$ flows in transistor 15. $I_5$ is greater than $I_6$ by the value of $I_2$. Since $I_2$ is normally kept small with respect to $I_5$, $I_5$ and $I_6$ are nearly equal.

In a preferred embodiment $I_1$ and $I_2$ were each made 100 microamperes, while $I_5$ was 600 microamperes and $I_6$ was 500 microamperes. This quiescent bias level was achieved by ratioing the areas of transistors 17 and 18 with transistors 14 and 16. When a signal is applied to terminal 13 the negative excursions will increase the conduction in transistor 14 so that the stage will source current to output terminal 12. The maximum source current will be equal to $I_1$ multiplied by the Beta of transistor 14. It is to be understood that if a higher source current is desired, a Darlington driver (not shown) can be coupled to transistor 14 and a matching Darlington driver coupled to transistor 15. If this is done an additional biasing diode would have to be coupled in series with diode connected transistor 17.

For a positive signal input excursion the emitter of transistor 21 will pull the emitter of transistor 20 up. This action will reduce conduction in transistor 20 and therefore force a portion of $I_2$ into the base of transistor 15 which causes it to sink current from terminal 12. The maximum sink current will be equal to the Beta of transistor 15 multiplied by $I_2$.

While the emitters of transistors 20 amd 21 are returned to ground by means of resistor 22 a constant current device 28, shown in dashed outline, can replace resistor 22 to conduct $I_3$. Device 28 would then be designed to conduct twice the current $I_1$. This would force $I_2 = I_1$.

From the above it can be seen that the signal drive to transistor 15 at high frequencies is by way of NPN transistors. The PNP device is only used to establish the quiescent bias and operate at low frequencies. This removes the asymmetry in high frequency response normally found in quasi-complementary stages.

The invention has been described in sufficient detail to enable a person skilled in the art to practice the invention. When such a person reads the foregoing description alternatives and equivalents, within the spirit and intent of the invention, will be apparent. For example, any of the transistors in the drawing could have its function replaced by an equivalent composite IC structure. Also, all of the devices shown could be replaced by their complements and the power supply polarity reversed. Accordingly, it is intended that the scope of the invention be limited only by the claims that follow.

I claim:

1. A class B integrated circuit output circuit having an input terminal, an output terminal, and first and second supply terminals connectable to a source of operating power, said circuit comprising:

first and second transistor means having a first polarity, each having a base and having their emitter-collector circuits coupled in series across said first and second supply terminals whereby the juncture of said first and second transistor means comprises said output terminal;

third transistor means having said first polarity with its collector coupled to said base of said second transistor means, its emitter coupled to said second supply terminal and its base coupled to a source of bias potential;

fourth transistor means having said first polarity with its emitter coupled to said emirter of said third transistor means, its collector coupled to said base of said first transistor means, and its base coupled to said circuit input terminal; and means for forcing said third transistor means to operate as a diode at the higher signal frequencies.

2. The circuit of claim 1 including fifth transistor means having a complementary polarty with its collector coupled to said base of said second transistor means and its base coupled to said collector of said fourth transistor means whereby said second and fifth transistor means in combination provides quasi-complementrary transistor means with respect to said first transistor means.

3. The circuit of claim 1 wherein said emitters of said third and fourth transistor means are coupled to said second supply terminal by current conducting means whereby said fourth transistor means acts as an emitter-follower to drive said emitter of said third transistor means.

4. The circuit of claim 3 in further combination with a clamping diode means having one terminal coupled to said collector of said third transistor means and its other terminal coupled to a source of clamping potential selected to prevent said third transistor means from being driven into saturation.

* * * * *